(12) United States Patent
Kang et al.

(10) Patent No.: US 9,638,376 B2
(45) Date of Patent: May 2, 2017

(54) SUSCEPTOR

(75) Inventors: Ju Jin Kang, Gumi-si (KR); Young Su Ku, Gumi-si (KR)

(73) Assignee: LG Siltron Inc., Gumi-Si (KR)

( * ) Notice: Subject to any disclaimer, the term of this patent is extended or adjusted under 35 U.S.C. 154(b) by 414 days.

(21) Appl. No.: 13/593,709

(22) Filed: Aug. 24, 2012

(65) Prior Publication Data
US 2013/0048629 A1 Feb. 28, 2013

(30) Foreign Application Priority Data

Aug. 26, 2011 (KR) .......................... 10-2011-0085750
Jan. 13, 2012 (KR) .......................... 10-2012-0004218

(51) Int. Cl.
H05B 6/64 (2006.01)
H05B 6/10 (2006.01)
(Continued)

(52) U.S. Cl.
CPC ............ F17D 3/00 (2013.01); C23C 16/4583 (2013.01); C23C 16/4586 (2013.01); H05B 6/806 (2013.01); Y10T 137/0318 (2015.04)

(58) Field of Classification Search
CPC ....... H05B 6/806; F17D 3/00; C23C 16/4584; C23C 16/45508; C23C 16/4585; C23C 16/45519; C23C 16/4405; C23C 16/4583; C23C 16/46; H01L 21/68735; H01L 21/68785; H01L 21/67109; C30B 25/12; C30B 29/06; C30B 31/14; C30B 25/10; F27B 14/061; F27B 14/14; F27B 14/0025

USPC ....... 219/759, 634, 730, 731, 651, 683, 686, 219/707, 74, 121.33, 121.51, 121.55, 133, 219/137.42, 137.9; 137/1, 15.03, 78.4, (Continued)

(56) References Cited

U.S. PATENT DOCUMENTS 4,275,282 A 6/1981 Miller
4,721,462 A 1/1988 Collins, Jr.
(Continued)

FOREIGN PATENT DOCUMENTS

CN 1526158 A 9/2004
CN 1956145 A 5/2007
(Continued)

OTHER PUBLICATIONS

International Search Report dated Jan. 2, 2013 issued in Application No. PCT/KR2012/006687.
(Continued)

Primary Examiner — David Angwin
Assistant Examiner — Gyounghyun Bae
(74) Attorney, Agent, or Firm — KED & Associates, LLP

(57) ABSTRACT

A susceptor includes a first body including a plurality of first holes and a second body including a plurality of second holes. According to one arrangement, the second body is spaced from the first body to form a gap which allows a gas to pass from the second holes to the first holes. According to this or another arrangement, the first body is removably or rotatably coupled to the second body, or both. Rotation of the second body by a first amount or in a first direction brings at least one first hole in alignment with at least one second hole. And, rotation of the second body by a second amount or in a second direction causes a misalignment to occur between these holes.

14 Claims, 10 Drawing Sheets

(51) Int. Cl.
*H01L 21/302* (2006.01)
*F17D 3/00* (2006.01)
*H05B 6/80* (2006.01)
*C23C 16/458* (2006.01)

(58) Field of Classification Search
USPC ....... 137/155, 156, 157, 159, 167, 168, 169,
137/170.1, 175, 179, 185, 193, 197, 206,
137/209, 210, 211, 211.5, 212, 213, 314,
137/315.06, 361, 388, 505.19, 583, 587;
427/248.1, 255.28, 719, 255.5; 134/1.1,
134/22.1, 31, 35, 36; 118/715, 725, 726,
118/728, 724, 730, 729, 52, 500, 719;
117/951; 438/905, 706–744; 269/903
See application file for complete search history.

(56) References Cited

U.S. PATENT DOCUMENTS

| | | | |
|---|---|---|---|
| 5,120,274 A | | 6/1992 | Zeller |
| 5,310,453 A | * | 5/1994 | Fukasawa ........... H01L 21/6833 438/716 |
| 5,522,937 A | * | 6/1996 | Chew et al. .................. 118/728 |
| 5,542,559 A | * | 8/1996 | Kawakami .......... H01L 21/6838 118/723 E |
| 5,558,717 A | * | 9/1996 | Zhao et al. .................... 118/715 |
| 5,665,167 A | * | 9/1997 | Deguchi et al. .............. 118/728 |
| 5,698,070 A | * | 12/1997 | Hirano et al. ................. 438/729 |
| 5,849,092 A | * | 12/1998 | Xi et al. ......................... 134/1.1 |
| 5,895,530 A | * | 4/1999 | Shrotriya et al. ............. 118/715 |
| 6,033,480 A | * | 3/2000 | Chen et al. .................... 118/715 |
| 6,063,196 A | * | 5/2000 | Li et al. .......................... 118/712 |
| 6,109,209 A | * | 8/2000 | Rudolph ................. C04B 35/83 118/715 |
| 6,113,704 A | * | 9/2000 | Satoh et al. ................... 118/728 |
| 6,897,419 B1 | * | 5/2005 | Brown ................... H05B 6/365 219/634 |
| 7,585,386 B2 | * | 9/2009 | Okumura et al. ........ 156/345.51 |
| 7,638,003 B2 | * | 12/2009 | Satoh et al. ................... 118/728 |
| 7,959,735 B2 | * | 6/2011 | Sterling et al. ............... 118/715 |
| 2001/0054387 A1 | * | 12/2001 | Frankel et al. ............... 118/725 |
| 2003/0062359 A1 | * | 4/2003 | Ho .................... H01L 21/67103 219/444.1 |
| 2004/0028810 A1 | * | 2/2004 | Grant et al. ................ 427/248.1 |
| 2004/0040632 A1 | * | 3/2004 | Oosterlaken ................... 148/527 |
| 2004/0175939 A1 | * | 9/2004 | Nakamura .......... C23C 16/4581 438/689 |
| 2004/0255843 A1 | | 12/2004 | Yoshida et al. ................. 117/89 |
| 2005/0000449 A1 | | 1/2005 | Ishibashi et al. ............. 118/728 |
| 2005/0022737 A1 | * | 2/2005 | Shimizu .............. C23C 16/4585 118/715 |
| 2005/0217585 A1 | * | 10/2005 | Blomiley ............ C23C 16/4586 118/728 |
| 2005/0233155 A1 | * | 10/2005 | Won et al. ..................... 428/446 |
| 2006/0021574 A1 | * | 2/2006 | Armour et al. ............... 118/715 |
| 2006/0177579 A1 | * | 8/2006 | Shin et al. .................. 427/248.1 |
| 2006/0263522 A1 | * | 11/2006 | Byun .......................... 427/248.1 |
| 2006/0269390 A1 | * | 11/2006 | Nakamura et al. ........... 414/935 |
| 2007/0089836 A1 | | 4/2007 | Metzner et al. |
| 2007/0101940 A1 | * | 5/2007 | Iizuka .......................... 118/726 |
| 2008/0069951 A1 | * | 3/2008 | Chacin et al. ............. 427/248.1 |
| 2008/0110401 A1 | * | 5/2008 | Fujikawa et al. ............. 118/724 |
| 2009/0061538 A1 | * | 3/2009 | Heo ........................ H01G 4/085 438/3 |
| 2009/0148704 A1 | * | 6/2009 | Takasuka ............. C23C 16/4401 428/411.1 |
| 2009/0311430 A1 | * | 12/2009 | Ito ................................. 427/314 |
| 2010/0071624 A1 | * | 3/2010 | Lee ................... H01L 21/68742 118/729 |
| 2010/0124610 A1 | * | 5/2010 | Aikawa et al. ........... 427/255.28 |
| 2010/0162956 A1 | * | 7/2010 | Murakami .......... C23C 16/4586 118/725 |
| 2010/0199914 A1 | | 8/2010 | Iza ................................ 118/725 |
| 2010/0227059 A1 | * | 9/2010 | Kato et al. ................ 427/255.28 |
| 2011/0011338 A1 | | 1/2011 | Chuc et al. |
| 2011/0048453 A1 | * | 3/2011 | Honda et al. .................. 134/1.1 |
| 2011/0171380 A1 | * | 7/2011 | Higashi ............... C23C 16/4586 427/248.1 |
| 2012/0003389 A1 | * | 1/2012 | Brien ..................... C23C 16/46 427/255.23 |

FOREIGN PATENT DOCUMENTS

| | | |
|---|---|---|
| CN | 102754190 A | 10/2012 |
| JP | S 59-043539 A | 3/1984 |
| JP | 08-008198 A | 1/1996 |
| JP | 2002-351082 A | 12/2002 |
| JP | 2010-177607 A | 8/2010 |
| JP | 2011-021253 A | 2/2011 |
| KR | 10-2004-0061007 A | 7/2004 |
| KR | 10-2004-0066093 A | 7/2004 |
| KR | 10-2010-0061740 A | 6/2010 |
| KR | 10-2011-0087440 A | 8/2011 |
| WO | WO 03/060967 A1 | 7/2003 |

OTHER PUBLICATIONS

Japanese Office Action dated Feb. 3, 2015 issued in Application No. 2014-527072.
European Search Report dated Jan. 30, 2015 issued in Application No. 12827558.3.
Taiwanese Office Action dated Mar. 11, 2015 issued in Application No. 101130230.
Chinese Office Action dated Sep. 25, 2015 issued in Application No. 201280041809.8.
Japanese Office Action dated Feb. 16, 2016 issued in Application No. 2014-527072.

* cited by examiner

SUSCEPTOR

CROSS-REFERENCE TO RELATED APPLICATIONS

The present application claims the benefit of priority under 35 U.S.C. 119 to Korean Patent Application No. 10-2011-0085750, filed on Aug. 26, 2011, which is hereby incorporated by reference in its entirety. In addition, the present application claims the benefit of priority under 35 U.S.C. 119 to Korean Patent Application No. 10-2012-0004218, filed on Jan. 13, 2012.

BACKGROUND

1. Field

One or more embodiments described herein relate wafer fabrication.

2. Background

Semiconductor wafers are farmed using various techniques. One technique involves cutting a cylindrical ingot, grown using a Czochralski method, into thin disk shapes with a cutter and then chemically and mechanically grinding the surfaces thereof.

A process of forming a high purity crystalline layer with crystal orientations aligned on a surface of a single crystalline silicon wafer grown using the Czochralski method is referred to as an epitaxial growth method or, more simply, an epitaxial method. A layer formed using this method is called an epitaxial layer or an epi-layer, and a wafer including an epi-layer is called an epitaxial wafer. One type of epitaxial method is performed by a reactor which operates under high temperature conditions and which includes a susceptor on which a wafer is placed to grow an epi-layer.

Epitaxial methods have proven to have drawbacks. For example, n-type or p-type ions may migrate between a susceptor and an upper surface of a polished wafer. As a result, the edge of the wafer may be doped with ions to an undesirably high concentration. This is called auto-doping. Another drawback relates to the inability of a cleaning gas to completely remove a natural oxide layer from a wafer. As a result, reaction gas may be deposited on a rear surface of the wafer during epitaxial deposition, which is called haloing.

Auto-doping and haloing significantly degrade wafer quality and the corresponding semiconductor chip made from the wafer.

Another drawback relates to the heat generated from a heating source during chip fabrication. This heat places thermal stress on the wafer, which, in turn, may cause slip dislocation and increase surface roughness of a rear surface of the wafer, both of which may degrade the nano-quality of the wafer. In addition, a heavily and thermally stressed region may cause a defect to occur in a device process.

Another drawback of susceptors relates to wear during use. More specifically, because the wafer is placed on a susceptor during a heating process, the susceptor may be worn by friction. Even though a small portion of a silicon carbide coating layer formed on the susceptor may be damaged by the friction, the susceptor should be replaced with a new one. Otherwise, material such as graphite removed from the susceptor may cause an epitaxial reactor to malfunction. This increases operation costs of the epitaxial reactor.

DETAILED DESCRIPTION

Figure 1:
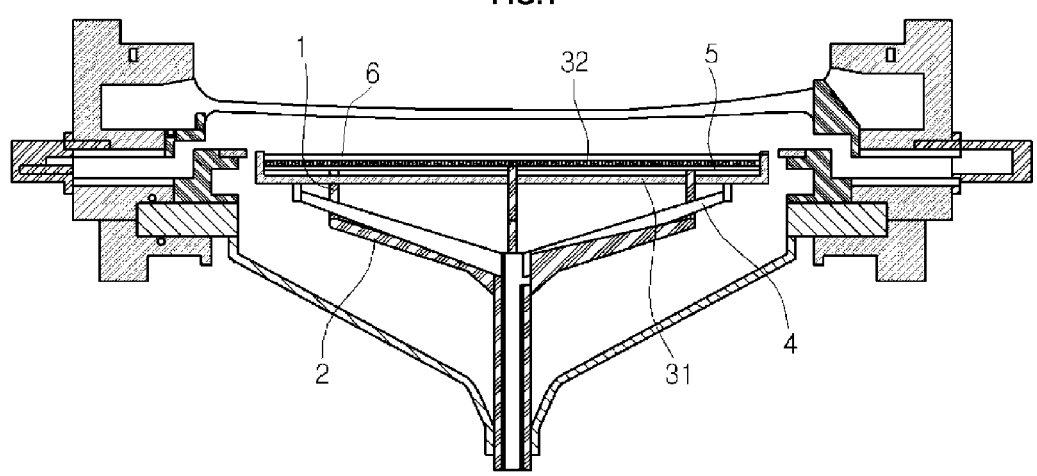
FIG. 1 shows one embodiment of an epitaxial reactor.

FIG. 1 shows a first embodiment of an epitaxial reactor which includes one or more lift pins 1, a lift pin support shaft 2, and a blade 5. The blade 5 is used for loading and unloading a wafer 6 to and from a reactor. When the blade is taken out, the lift pin support shaft 2 pushes up the lift pins 1 to support the wafer from a lower surface of the wafer. When a plurality of lift pins are included, the lift pins 1 are spaced apart from each other to provide support of the wafer.

The reactor also includes a susceptor 3. As shown, the wafer 6 is placed on a susceptor 3. When the epitaxial reactor is operated, the susceptor 3 heats the wafer 6. A susceptor supporting shaft 4 moves the susceptor in upward and downward directions and supports the susceptor 3 from a lower side thereof. In accordance with one embodiment shown in FIG. 2, the susceptor 3 may include two parts, namely a first body 31 serving as a main frame and a second body 32 placed on or over the first body 31.

In operation, when the blade 5 loads the wafer 6 into the epitaxial reactor, the lift pins 1 are moved upward to support the wafer 6. Then, blade 5 is removed. After that, the lift pins 1 are moved downward and the wafer 6 is placed on the susceptor 3 supported by the susceptor supporting shaft 4. Thereafter, a series of processes including a susceptor heating process are performed to grow a single crystalline layer.

Figure 2:
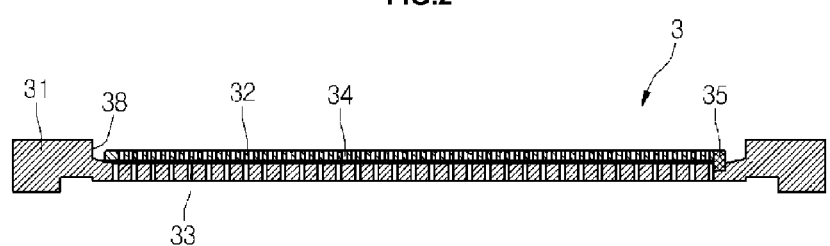
FIG. 2 shows a cross-sectional view of a susceptor in FIG. 1.

FIG. 2 shows a cross-sectional view of the susceptor 3 in FIG. 1. As shown, the wafer 6 is placed over the second body 32 and the first body 31 supports the second body 32 from a lower side thereof. The susceptor 3 has lift pin holes to allow vertical movement of the lift pins 1. The first body 31 may be provided with a seat part 38 recessed downward and the second body 32 may be seated adjacent the seat part. The first and second bodies 31 and 32 include holes 33 and 34 to allow for movement of gas to the lower side thereof. The holes 33 and 34 reduce or suppress auto-doping and haloing.

A fixing member may be provided to fix the second body 32 in a predetermined position relative to the first body 31. The fixing member may include a fixing pin 35. In accordance with one embodiment, the fixing pin 35 is fitted in both a hole of the second body 32 and a recess of the first body 31, to thereby fix a relative position between the first and second bodies 31 and 32. In accordance with the same or another embodiment, two fixing pins 35 may be provided. As shown in FIG. 2, the fixing pin 35 may be disposed at an edge of the second body 32 to thereby facilitate installation of the susceptor 3.

During operation, gas may enter the holes in the second body 32 in various ways. For example, the wafer 6 may be thin and not perfectly flat. In this case, undulations in the wafer may create spaces which may allow processing gases (e.g., discharge gas, cleaning gas, etc.) to propagate under the wafer to enter the holes in the second body.

Additionally, or alternatively, heat from a heat source may cause the wafer to temporarily deform to thereby create spaces for allowing gas to enter the underlying holes in the second body. Additionally, or alternatively, the upper surface of the second body may be partially or wholly curved. This will allow spaces to formed between the bottom surface of the wafer and the top surface of the second body, which spaces will allow gas to enter the holes of the second body.

Additionally, or alternatively, the width of the wafer 6 may not be co-extensive with the width of the second body. As a result, holes along the peripheral edge of the second body may be left uncovered by the wafer, thereby allowing gas to enter the holes in the second body.

In accordance with one or more embodiments, a certain gap may exist between the first and second bodies 31 and 32. Thus, gas discharged to the lower side of the second body 32 can flow between the first body 31 and the second body 32. The gas flowing between the first body 31 and the second body 32 may be discharged through the first body 31. In accordance with one embodiment, a gap structure between the first and second bodies 31 and 32 may have a curved surface. In other embodiments, the gap structure may have a flat or different shaped surface.

Figure 3:
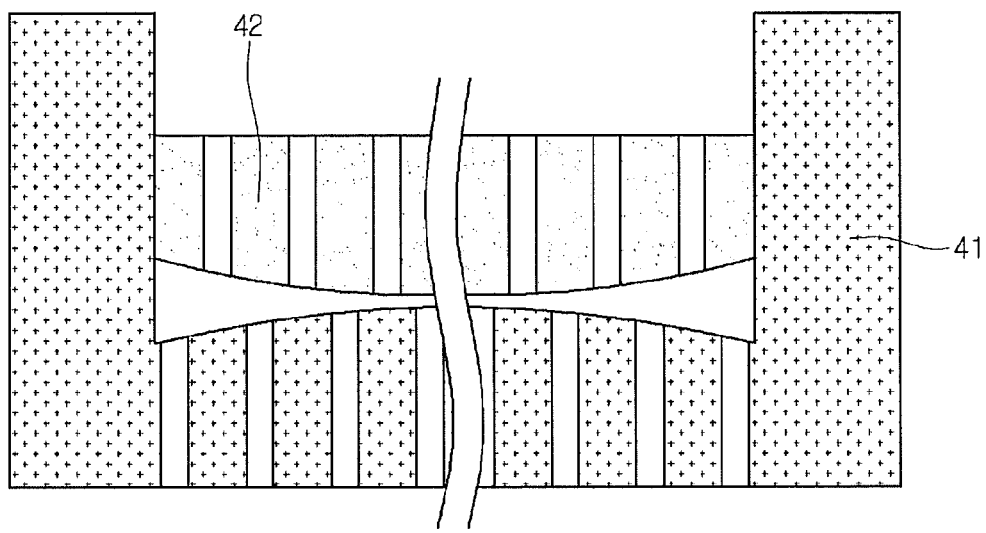
FIGS. 3 to 6 show how a gap may be formed between bodies of a susceptor.

FIGS. 3 to 6 show cross-sectional views of various structures for maintaining a certain gap between first and second bodies of a susceptor. Referring to FIG. 3, a first body 41 has a convex top surface and a second body 42 has a convex bottom surface. The convex surfaces face each other. With such a structure, gas can flow within a space between the curves surfaces of the first and second bodies 41 and 42.

Figure 4:
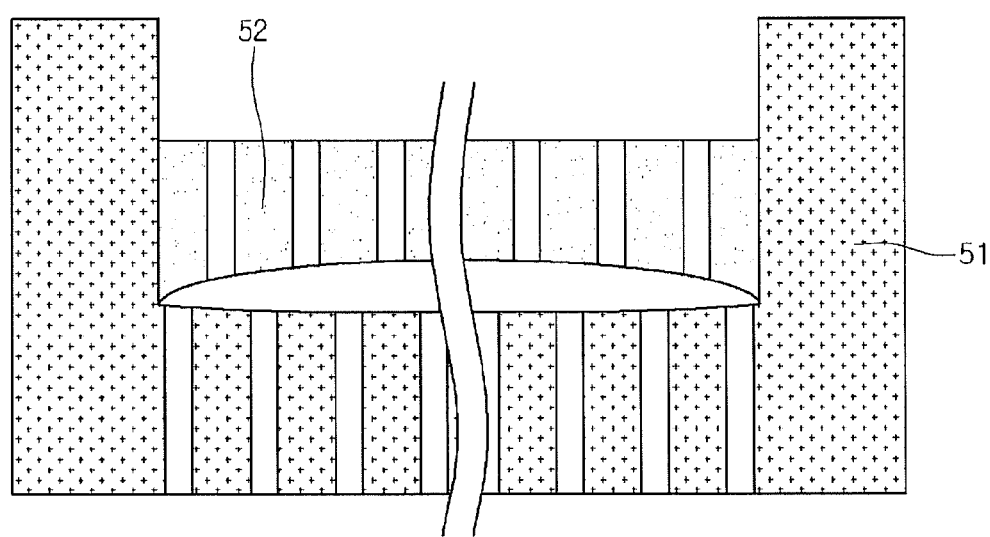

Referring to FIG. 4, a first body 51 has a concave top surface and a second body 52 has a concave bottom surface which faces the concave surface of the first body. With this structure, gas can flow within a space between the surfaces of the first and second bodies 51 and 52.

Figure 5:
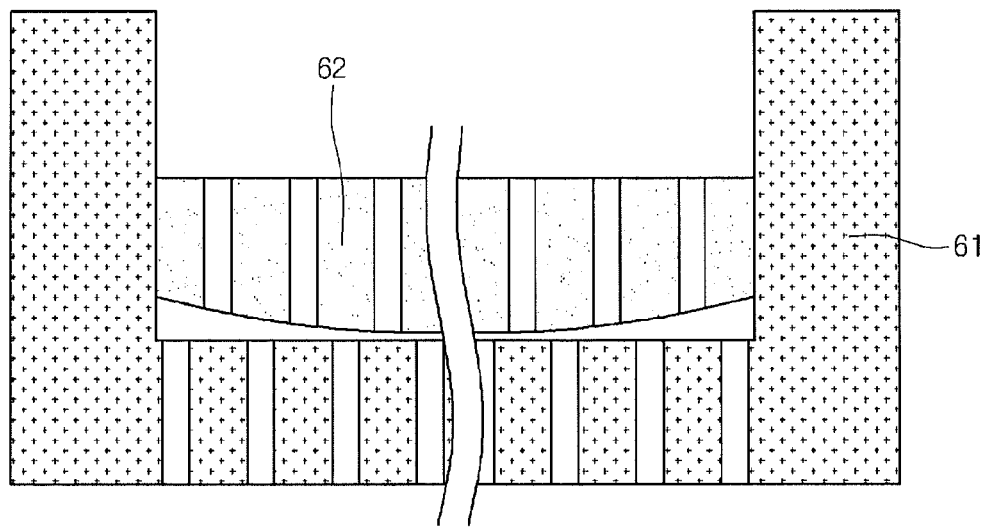

Referring to FIG. 5, a first body 61 has a flat top surface and a second body 62 has a convex bottom surface which faces the flat top surface of the first body. With this structure, gas can flow within a space between the opposing surfaces of the first and second bodies 61 and 62.

Figure 6:
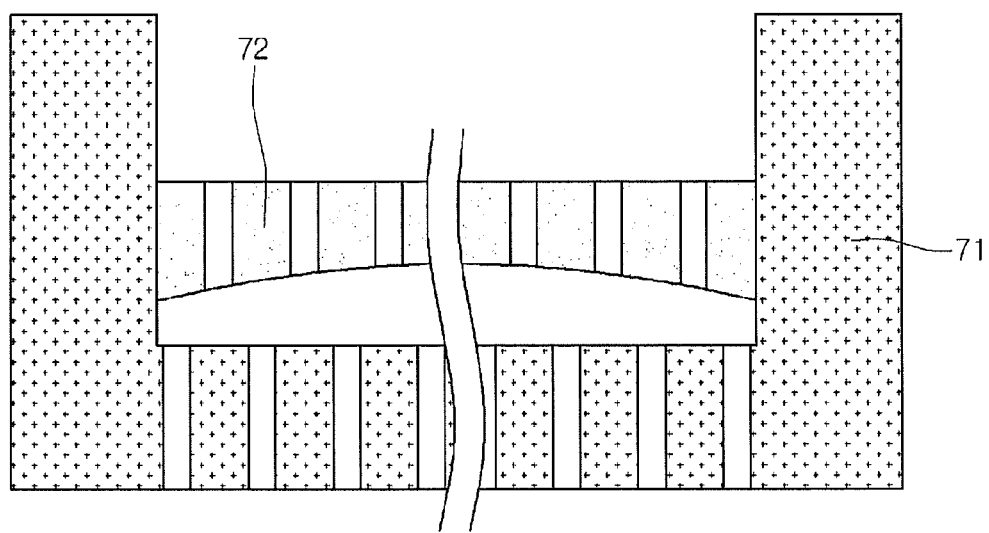

Referring to FIG. 6, a first body 71 has a flat top surface and a second body 72 has a concave bottom surface which faces the flat top surface of the first body. With this structure, gas can flow within a space between the opposing surfaces of the first and second bodies 71 and 72.

In accordance with another embodiment, a second body may have a flat bottom surface and a first body may have a concave or convex top surface. Also, in this case, reaction gas can efficiently flows within a space between the first and second bodies, thereby suppressing auto doping and haloing, and relieving thermal stress.

In accordance with any of the aforementioned embodiments, the holes 33 and 34 in the first and second bodies may have predetermined sizes. For example, in accordance with one embodiment, the holes 33 (also, referred to as a first hole) may have a size ranging from about 0.3 mm to about 10 mm and the holes 34 (also, referred to as a second hole) may have a size ranging from about 0.3 mm to about 1.5 mm.

If the holes 34 are smaller than holes 33, damage from thermal stress applied directly to the wafer from the holes 34 (which are disposed just below the bottom surface of the wafer in this embodiment) can be reduced or eliminated. The relationship between hole size and damage may be directly proportional, i.e., as hole size decreases damage from thermal stress is decreases.

To prevent auto-doping, holes 33 and 34 may be disposed in a predetermined region. In accordance with one embodiment, the predetermined region extends from a portion of the susceptor 3 spaced inward from the edge of a wafer by a certain amount (e.g., about 2 mm) to a center or central region of the susceptor 3.

The region in which holes 33 and 34 are disposed will now be described in more detail. The holes 33 in the first body may be disposed from a portion of the first body 31 radially spaced inward from the edge thereof by about 50 mm. According to one embodiment, the holes 34 in the second body are disposed throughout the entire region corresponding to the second body 32. Alternatively, holes 33 may be disposed from a portion of the first body 31 radially spaced inward from the edge thereof by about 80 mm, and holes 34 may be disposed from a portion of the second body 32 radially spaced inward from the edge thereof by about 20 mm. According to this configuration, the region of a first body in which holes are disposed and the region of a second body in which holes are disposed may not degrade the discharging efficiency of gas.

Although the holes 33 and 34 in the first and second bodies are disposed in the first and second bodies 31 and 32 in previous embodiments, both of the first and second bodies 31 and 32 may not have holes in other embodiments.

Also, in any of the previous embodiments or the no-hole embodiments, the first and second bodies may be formed so that the second body 32 can be replaced with a new body 32 without replacing first body 31. This may prove beneficial, for example, when the second body has experienced wear during use, but the first body is still in good condition. Forming the first and second bodies so that the second body is replaceable in this manner alleviates the inconvenience and cost of having to replace the entire susceptor.

In the no-hole embodiments, while the ability to discharge gas through holes in a susceptor may not be attained, the ability to separately replace only one of the two bodies of the susceptor may prove beneficial. The ability to remove the second body relative to the first body may be achieved, for example, by using fixing member 35 which may be removable to allow for second-body replacement in the susceptor.

Table 1 shows an example of effects which may be produced for different embodiments of the susceptor, specifically relating to the configuration of the second body.

TABLE 1

| | | Second Body Configuration | | |
|---|---|---|---|---|
| Classification | No Hole | Holes in Whole Area | Holes in Central area | Holes in Edge Area |
| First Body / No Hole | Only Second Body Replaceable Decrease of Maintenance Cost of Epitaxial Reactor | Only Second Body Replaceable Decrease of Maintenance Costs of Epitaxial Reactor | Only Second Body Replaceable Decrease of Maintenance Costs of Epitaxial Reactor | Only Second Body Replaceable Decrease of Maintenance Costs of Epitaxial Reactor |
| Holes in Whole Area | Only Second Body Replaceable Decrease of Maintenance Cost of Epitaxial Reactor | Only Second Body Replaceable Decrease of Maintenance Costs of Epitaxial Reactor Controllable Auto doping/Haloing/Thermal stress | Only Second Body Replaceable Decrease of Maintenance Costs of Epitaxial Reactor Controllable Auto doping/Haloing/Thermal stress | Only Second Body Replaceable Decrease of Maintenance Costs of Epitaxial Reactor Controllable Auto doping/Haloing/Thermal stress |
| Holes in Central area | Only Second Body Replaceable Decrease of Maintenance Costs of Epitaxial Reactor | Only Second Body Replaceable Decrease of Maintenance Costs of Epitaxial Reactor Controllable Auto doping/Haloing/Thermal stress | Only Second Body Replaceable Decrease of Maintenance Costs of Epitaxial Reactor Controllable Auto doping/Haloing/Thermal stress | Only Second Body Replaceable Decrease of Maintenance Costs of Epitaxial Reactor Controllable Auto doping/Haloing/Thermal stress |
| Holes in Edge Area | Only Second Body Replaceable Decrease of Maintenance Costs of Epitaxial Reactor | Only Second Body Replaceable Decrease of Maintenance Costs of Epitaxial Reactor Controllable Auto doping/Haloing/Thermal stress | Only Second Body Replaceable Decrease of Maintenance Costs of Epitaxial Reactor Controllable Auto doping/Haloing/Thermal stress | Only Second Body Replaceable Decrease of Maintenance Costs of Epitaxial Reactor Controllable Auto doping/Haloing/Thermal stress |

In the embodiments of FIGS. 1 through 6, the holes 33 and 34 in the first and second bodies are shown to extend vertically. In other embodiments, the holes may extend at predetermined angles in one or both of the first body. The inclination angles in these embodiments may vary. For example, the inclination angles of holes in the first body may be the same or different from the inclination angles of the holes in the second body. Also, in some embodiments, fewer than all the holes in the first body and/or the second body may be inclined while other holes in the first body and/or second body may be vertically oriented.

In some of the foregoing embodiments, the upper surface of the first body and the lower surface of the second body do not contact one another. According to one alternative embodiment, these surfaces may contact one another at one or more points. For example, one alternative to the embodiments of FIGS. 3 and 5 involve the first and second bodies contacting one another at a central region, e.g., the surfaces of the first and second bodies touch at a point which substantially corresponds to a center of these bodies. This touching may, in effect, define two gaps or spaces for allowing gas to pass from the holes in the second body to the holes in the first body.

As another alternative to the embodiments of FIGS. 4 and 6, respective edges of the first and second bodies may contact one another. These edges may correspond to right and left sides of the bodies when shown in cross-section. Also, in another embodiment, the bodies may contact one another at one or more other points that reside between the centers and ends of the bodies.

Figure 7:
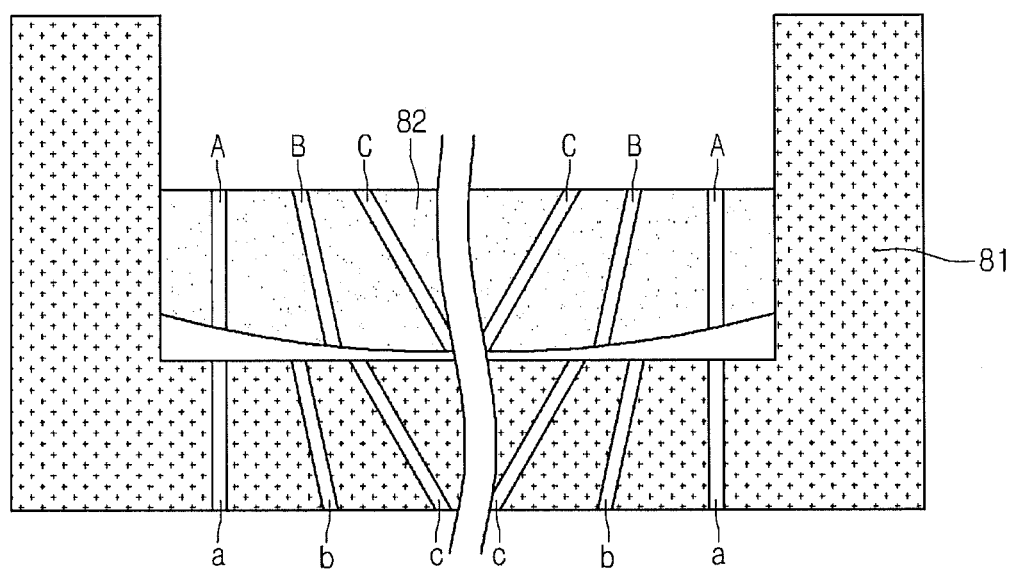
FIG. 7 shows a view of inclination angles of holes of a susceptor.

FIG. 7 shows a cross-sectional view of one example of inclination angles of holes in the first and second body according to one embodiment of the susceptor. Referring to FIG. 7, a second body 82 is placed over a first body 81 and holes are disposed in the first and second bodies 81 and 82. Two or more of these holes have different inclination angles and other holes may be vertical. For example, holes A and a are vertical, holes B and b are steeply inclined, and holes C and c are more gently inclined.

Thus, in this example, the holes of the first and second bodies 81 and 82 have various inclination angles. Also, one or more holes in the second body may be aligned with one or more holes in the first body. As shown in FIG. 7, a hole of the second body 82 (denoted by a capital letter) may be aligned with a hole of the first body 81 (denoted a small letter), e.g., hole A is substantially aligned with hole a. Other holes (e.g., ones having a non-vertical angle) may be misaligned.

In order to prevent lamp heat passing through the first body 81 from arriving at wafer 6 through the second body 82, holes in first and second bodies 81 and 82 which are inclined at non-vertical angles may not be aligned or may otherwise be located at different non-corresponding positions. In other embodiments, all the holes in the first body including the vertical ones may be misaligned or located at different positions relative to the holes in the second body.

In an alternative embodiment, the second body may be permanently fixed to a first body and holes of the second body may be misaligned with holes of the first body. In this case, although replacement of the second body may be difficult, auto doping, haloing, and thermal stress can be reduced or suppressed.

The size, density, and position of the holes of the susceptor can be controlled using process variables, and thus, are not limited to the numerical values according to any one embodiment described herein. For example, the holes in second body 32 may be larger than or the same size as the holes in the first body.

In accordance with one or more embodiments described herein, auto doping and/or haloing can be controlled and thermal stress can be suppressed. In addition, because only a portion (one body, e.g., the second body) of the susceptor can be replaced with a new one, without replacing the entire susceptor, maintenance costs of the epitaxial reactor can be decreased. Accordingly, the cost of wafers formed using the epitaxial reactor may be lower.

In other embodiments, a susceptor including a first body and a second body may be used as both a porous susceptor having holes and a normal susceptor having no hole.

Figure 8:
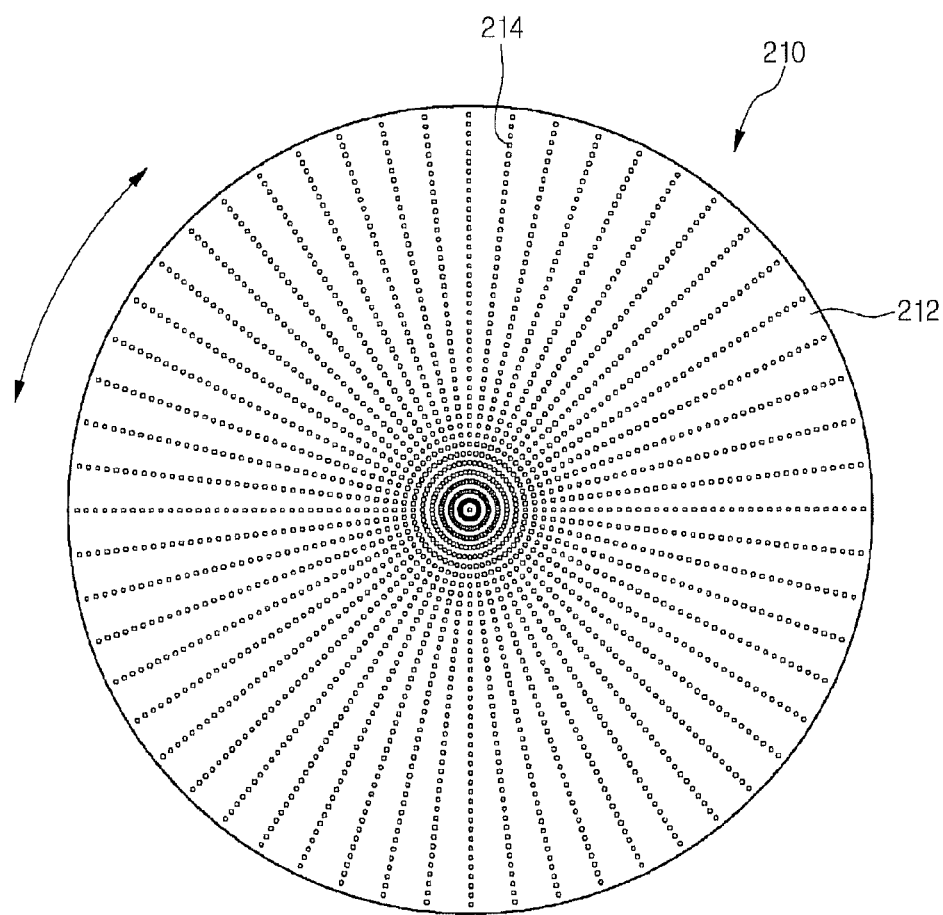
FIG. 8 shows a second body according to a one embodiment.
Figure 9:
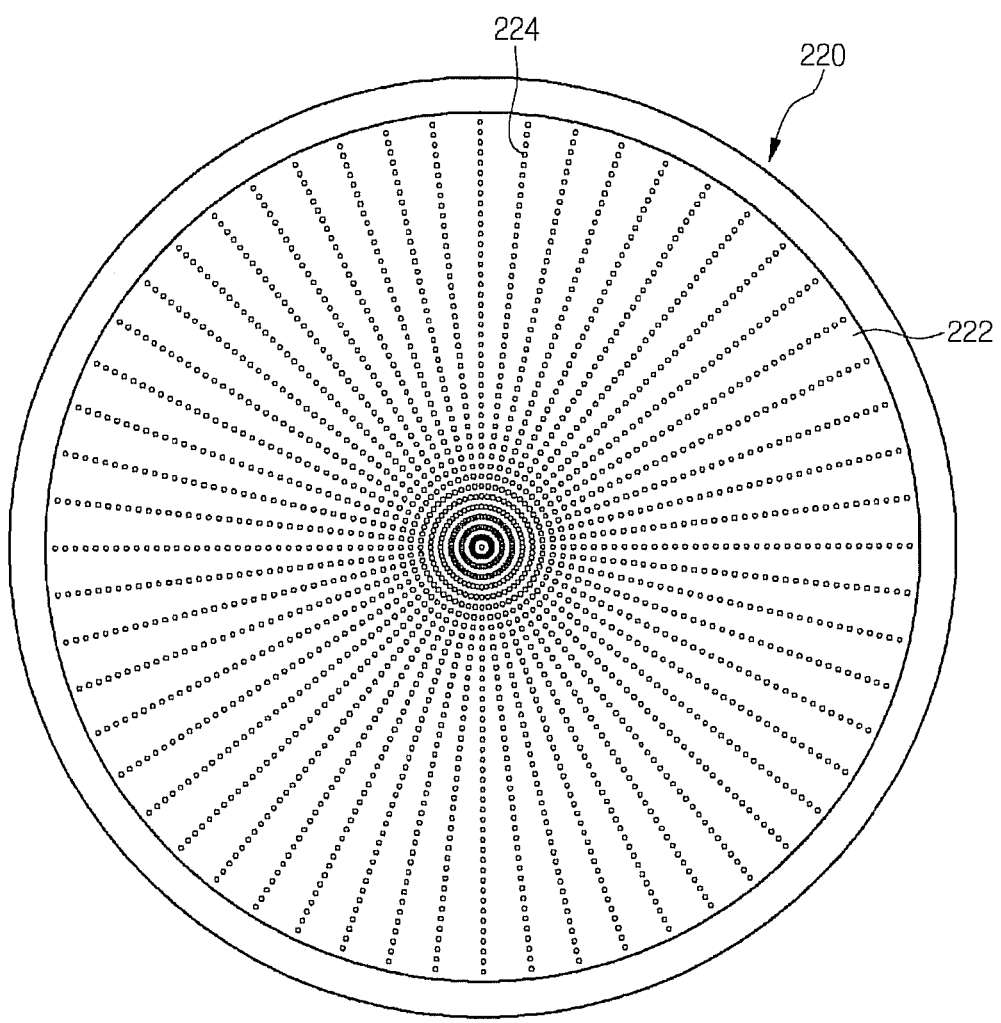
FIG. 9 shows a first body according to the one embodiment.

FIG. 8 shows a second body according to a second embodiment, and FIG. 9 shows a plan view of a first body of the second embodiment. Referring to FIGS. 8 and 9, a second body 210 includes a seat part 212 on which a wafer is placed and holes 214 disposed in the seat part 212. A first body 220 includes a seat recess 222 into which the second body 210 is placed and holes 224 in the first body disposed in a bottom surface of the seat recess 222. The second body 210 may be coupled to the first body 220 through a single rotation shaft, so that the second body 210 can be rotated clockwise or counterclockwise on the first body 220. The first body 220 may be immobilized.

The holes 214 of the second body 210 and the holes 224 of the first body 220 may be arrayed in the same or different radial shapes. When arrayed in with a same radial shape, holes 214 can be aligned with the holes 224 by rotating the second body 210. Misalignment can be achieved by further rotating the second body.

Figure 10:
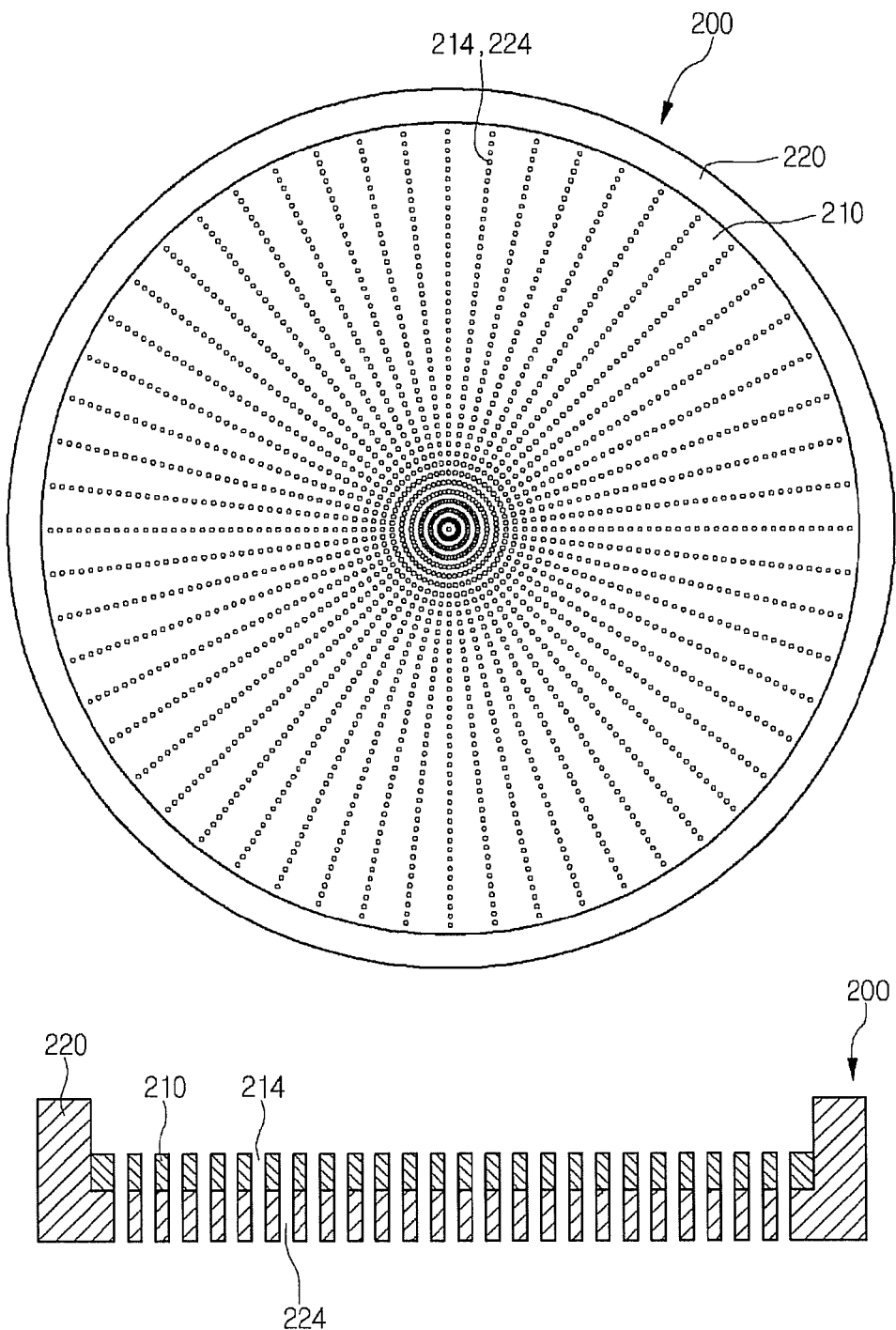
FIG. 10 shows a susceptor with a first arrangement of holes.

FIG. 10 shows views of a susceptor with holes in the second body are shifted and aligned with holes in the first body. In these views, the holes 214 of the second body 210 are aligned with the holes 224 of the first body 220, and a susceptor 200 is provided in the form of a porous susceptor. The porous susceptor may be formed by rotating the second body 210 clockwise or counterclockwise until the holes 214 are aligned with the holes 224.

Unlike in FIG. 10, the holes 214 in the second body may be partially aligned with the holes 224 in the first body or the holes 214 and 224 may be entirely misaligned. The holes may be partially misaligned if, for example, the holes in the first body have a different radial shape or spacing relative to the holes in the in the second body. For example, the angular spacing between the holes in one of the bodies may be twice the angular spacing between the holes in the other body. Thus, rotating the second body may cause even radial rows of holes to be aligned with holes in the first body but the odd radial rows may not be aligned with holes in the first body. In accordance with these embodiments, the porous susceptor may reduce or suppress haloing and auto doping, as described above.

Figure 11:
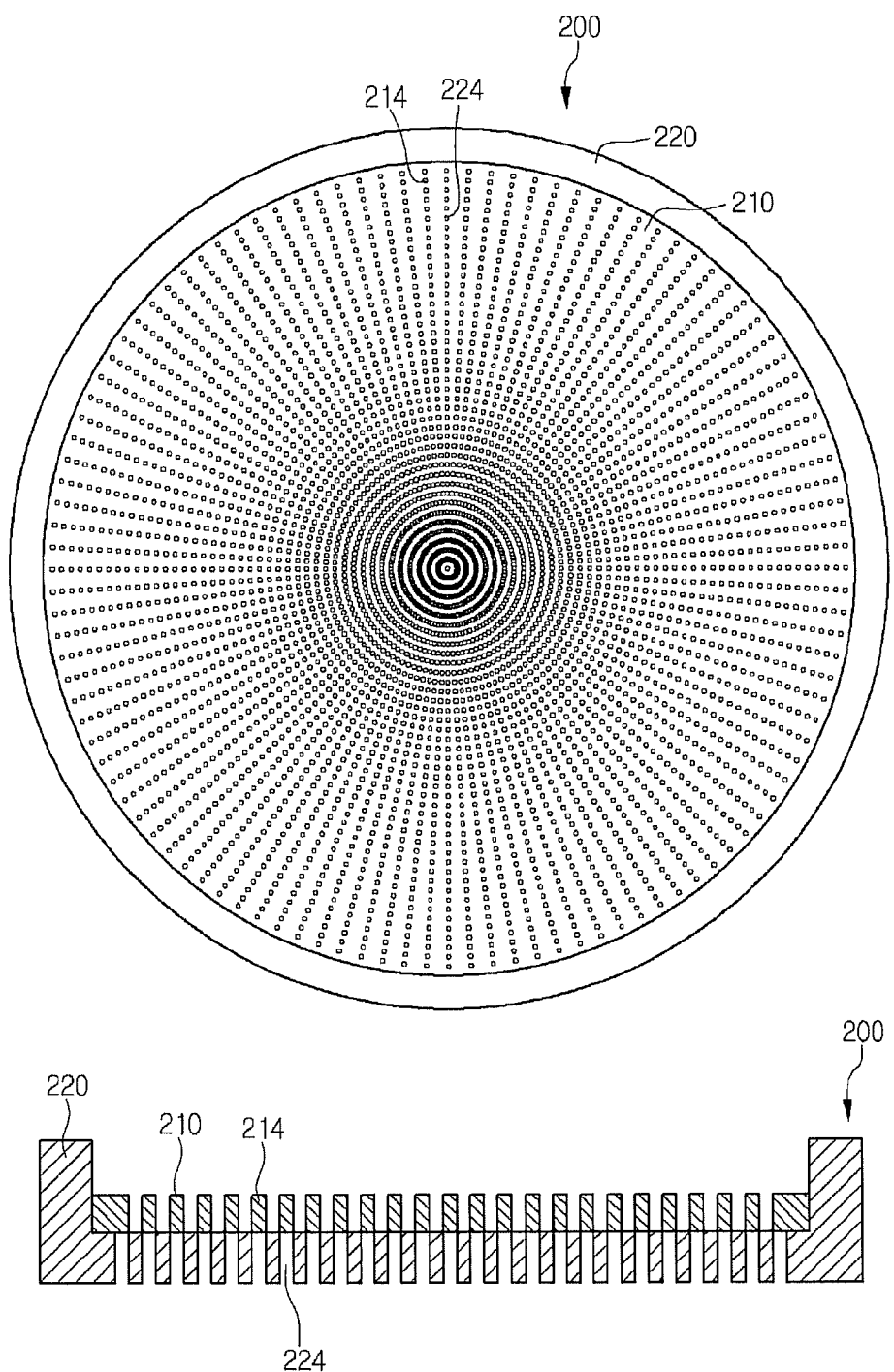
FIG. 11 shows a susceptor with a second arrangement of holes.

FIG. 11 shows views of a susceptor in which the holes in the second body are shifted and misaligned with the holes in the first body. Referring to FIG. 11, holes 214 of the second body 210 are misaligned with the holes 224 of the first body 220. When oriented in this manner, the susceptor 200 may effectively operate as a susceptor which has no holes. This may be accomplished by rotating the second body 210 clockwise or counterclockwise until the holes 214 in the second body are misaligned with the holes 224 in the first body. In this case, holes 214 may be completely or substantially misaligned with the holes 224.

A susceptor which effectively operates with no holes can control slip dislocation, edge stress, and minority carrier life time (MCLT). Particularly, since impurities can be more efficiently discharged through the normal susceptor, MCLT can be controlled more effectively.

The susceptor 200 may be used variously by modifying the arrangement of the holes 214 of the second body 210.

Figure 12:
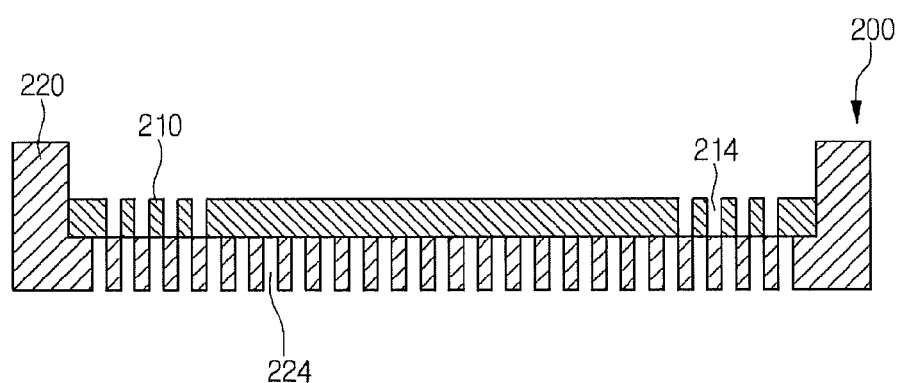
FIG. 12 shows a susceptor with holes in an edge region of a second body.
Figure 13:
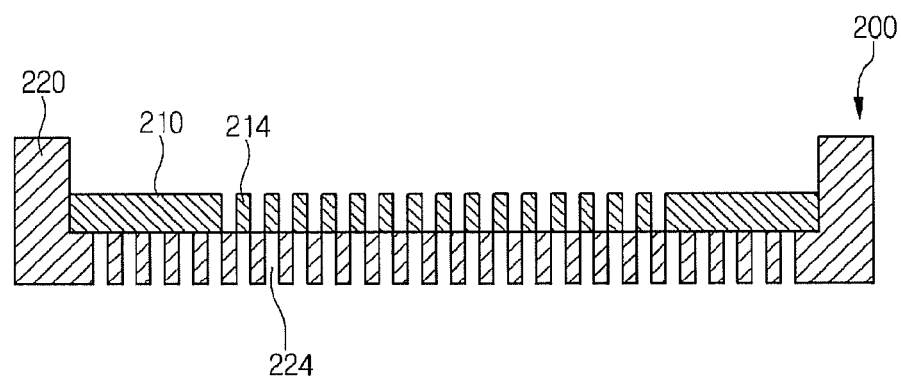
FIG. 13 shows a susceptor with holes in a center portion of a second body.
Figure 14:
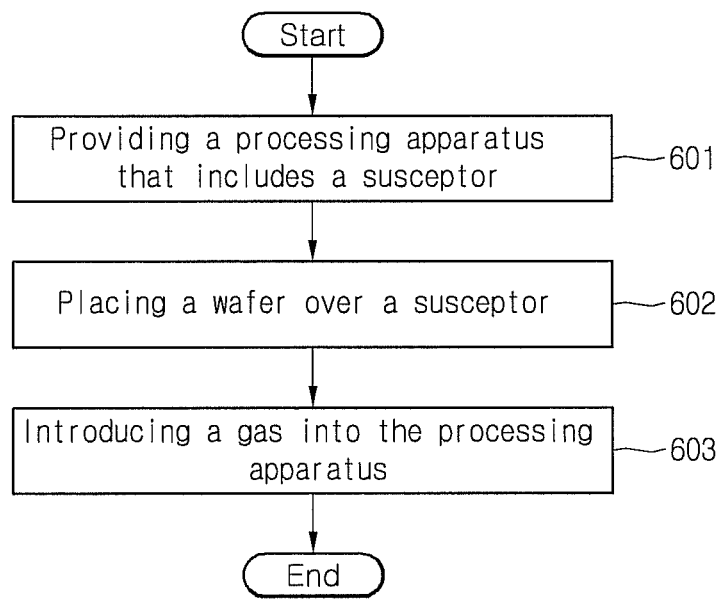
FIG. 14 shows a method for making a semiconductor device.

FIG. 12 shows a structure in which a second body has holes in only an edge region thereof, and FIG. 13 shows a structure in which a second body has holes in only a center portion and not at the edges.

In the susceptor of FIG. 12, resistance deviation may be decreased between the edge and center of a wafer, taking into consideration that the edge of a wafer is susceptible to auto-doping. In addition, a temperature gradient of the wafer may occur substantially in a radial direction according to heat radiation at the edge and thermal stress may be maximal at the edge of the wafer. Thus, slip dislocation may expand from the edge of the wafer to the center thereof.

In the susceptor of FIG. 13, a second body 210 of a susceptor has holes in only the central portion thereof, so as to prevent heat from a heating lamp from being emitted directly to the edge of a wafer.

FIG. 6 shows operations included in a method for making at least a portion of a semiconductor device, where the portion may include a wafer or substrate for use in the device. The device may include a processor, memory, bus structure, light emitter, or any device that can be manufactured using semiconductor technology.

The method includes providing a processing apparatus that includes a susceptor. (Block 601). The processing apparatus may be a processing chamber which introduces a discharge gas proximate the wafer for purposes of preparing the wafer for further semiconductor processing.

Additionally, or alternatively, the chamber may introduce a cleaning gas for purposes of cleaning the wafer before or after discharge and/or another type of processing operation is performed.

A second operation includes placing a wafer over the susceptor. (Block 602). This may be accomplished, for example, by a robot arm or blade placing the wafer over and/or onto the susceptor. For example, as shown in FIG. 2 the blade may place the wafer into a recess of the susceptor at a location over the holes.

A third operation includes introducing a gas into a location of the chamber that includes the wafer and susceptor. (Block 603). The gas may be, for example, any of the gases previously mentioned or another gas, and the susceptor may have a configuration in accordance with any of the embodiments described herein.

According to the one or more of the foregoing embodiments, a susceptor having dual capability is provided. The susceptor may operate as one with no holes when the second body is rotated to cause the holes in the first and second body to be misaligned. And, the susceptor may operate as one having holes when the second body is rotated to align the holes in the first and second bodies.

According to one or more of the embodiments, slip dislocation, edge stress, MCLT, auto-doping, and haloing can be controlled. Furthermore, operation costs of an epitaxial reactor can be decreased. Auto-doping or other non-uniformity effects may be controlled, for example, as a result of ions or dopants passing through the holes in the first and second bodies to prevent, for example, an over concentration of doping at any one region of the wafer.

In accordance with one embodiment, a susceptor comprises a first body including a plurality of first holes; and a second body including a plurality of second holes, wherein: the second body is spaced from the first body to form a gap, the gap allows a gas to pass from the second holes to the first holes, and the second body has a first surface and a second surface between the first surface and the first body, wherein the second holes extend between the first surface and the second surface of the second body.

The first and second holes may be misaligned, may be in substantial alignment, or a first number of first holes may be in substantial alignment with a first number of second holes and a second number of first holes may be misaligned with a second number of second holes.

The first body may have a first surface and a second surface between the second body and the first surface of the first body, and the first holes extend between the first and second surfaces of the first body. The second surfaces of the first and second bodies may face one another, and the second surfaces may have different cross-sectional shapes. The cross-sectional shapes may be selected from a group consisting of linear, curved in a convex direction, and curved in a concave direction.

The first and second holes may be oriented in substantially a vertical direction, the first and second holes may be oriented at different angles, or one of the first holes or the second holes may be oriented in substantially a vertical direction and the other of the first holes or the second holes may be oriented at one or more inclined angles.

Also, a first number of first holes and a first number of second holes may be oriented at substantially a first angle, and a second number of first holes and a second number of second holes may be oriented at one or more second angles different from the first angle. The first angle may be vertical.

Also, the first number of first holes and the first number of second holes may be in substantial alignment and wherein the second number of first holes and the second number of second holes are misaligned.

Also, the first body may be removably coupled relative to the second body, and the first body may be removably coupled relative to the second body by a removable fastener. The fastener may be located along a peripheral edge of the second body in overlapping relationship with the first body. The may be located in at least one of the second holes of the second body.

Also, the second body may be rotatably coupled relative to the first body. Rotation of one of the first body or the second body relative to the other of the first body or the second body by a first amount or first direction causes one or more of the first holes to be in substantial alignment with one or more second holes. And, rotation of one of the first body or the second body relative to the other of the first body or the second body by a second amount or second direction causes at least one first hole to be misaligned with all of the second holes. The first and second holes may have different sizes.

In accordance with another embodiment, a susceptor comprises a first body with first holes arranged in a first pattern; and a second body with second holes arranged in a second pattern, wherein: the second body rotates relative to the first body, rotation of the second body by a first amount or first direction causes one or more first holes to be in substantial alignment with one or more second holes, and rotation of the second body by a second amount or second direction causes the one or more first holes to be misaligned with the one or more second holes. The first pattern may be different from the second pattern.

The first pattern may have a first spacing between adjacent ones of the first holes and the second pattern has a second spacing between adjacent ones of the second holes, and wherein the first spacing is different from the second spacing. The first and second patterns may be radial patterns with different ones of said first and second spacings.

A position of the first body may be fixed. Also, the second body may be removably coupled relative to the first body. The second holes may be located in a first area and none of the second holes are located in a second area of the second body. Also, the first area may be one of a central area or a peripheral area of the second body, and the second area may be the other of the central area or peripheral area of the second body.

In accordance with another embodiment, aA method of making at least a portion of a semiconductor device, comprising: providing a processing apparatus that includes a susceptor; placing a wafer over the susceptor; and introducing a gas into a location of the processing apparatus that includes the wafer and susceptor.

The susceptor includes: a first body including a plurality of first holes; and a second body including a plurality of second holes, wherein: the second body is spaced from the first body to form a gap, the gap allows a gas to pass from the second holes to the first holes, and the second body has a first surface and a second surface between the first surface and the first body, wherein the second holes extend between the first surface and the second surface of the second body. The at least one portion of the semiconductor device may include a wafer, and the gas may be a discharge gas or a cleaning gas.

In accordance with another embodiment, aA method of making at least a portion of a semiconductor device, comprising: providing a processing apparatus that includes a susceptor; placing a wafer over the susceptor; and introducing a gas into a location of the processing apparatus that includes the wafer and susceptor.

The susceptor includes: a first body with first holes arranged in a first pattern; and a second body with second holes arranged in a second pattern, wherein: the second body rotates relative to the first body, rotation of the second body by a first amount or first direction causes one or more first holes to be in substantial alignment with one or more second holes, and rotation of the second body by a second amount or second direction causes the one or more first holes to be misaligned with the one or more second holes. The at least one portion of the semiconductor device may include a wafer, and the gas may be a discharge gas or a cleaning gas.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. The features of one embodiment may be combined with the features of one or more of the other embodiments.

Although embodiments have been described with reference to a number of illustrative embodiments, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A susceptor configured to support a silicon wafer to manufacture an epitaxial wafer in a chamber of a fabrication apparatus in which a gas is provided into the chamber, comprising:
   a first body of a susceptor including a top surface, a bottom surface and a plurality of first holes passing through the top surface and the bottom surface of the first body; and
   a second body of the susceptor including a top surface, a bottom surface and a plurality of second holes passing through the top surface and the bottom surface of the second body, the second body being configured to support a silicon wafer, to manufacture an epitaxial wafer,
   wherein the second body is positioned on and partially contacts the first body, at least one gap being provided between the bottom surface of the second body and the top surface of the first body to allow a passage of a gas between the first and second bodies,
   wherein the bottom surface of the second body and the top surface of the first body have different cross-sectional shapes across the susceptor including a center of the susceptor,
   wherein the cross-sectional shapes have contour lines selected from a group consisting of linear contour lines, contour lines curved in a convex direction and contour lines curved in a concave direction,
   wherein the first holes and the second holes are included in a predetermined region, the predetermined region extending from a portion of the susceptor spaced inward from an external edge of the silicon wafer by a prescribed amount to the center or a central region of the susceptor, and
   wherein a first number of first holes is in substantial alignment with a first number of second holes, and wherein a second number of first holes is misaligned with a second number of second holes.

2. The susceptor of claim 1, wherein the top surface of the second body is configured to support the silicon wafer.

3. The susceptor of claim 1, wherein the first and second holes are oriented in substantially a vertical direction.

4. The susceptor of claim 1, wherein the first and second holes are oriented at different angles.

5. The susceptor of claim 1, wherein one of the first holes or the second holes are oriented in substantially a vertical direction and the other of the first holes or the second holes are oriented at one or more inclined angles.

6. The susceptor of claim 1, wherein:
   a first number of first holes and a first number of second holes are oriented at substantially a first angle, and
   a second number of first holes and a second number of second holes are oriented at one or more second angles different from the first angle.

7. The susceptor of claim 6, wherein the first angle is vertical.

8. The susceptor of claim 1, wherein the first body is removably coupled relative to the second body.

9. The susceptor of claim 8, wherein the first body is removably coupled relative to the second body by a removable fastener.

10. The susceptor of claim 9, wherein the fastener is located along a peripheral edge of the second body in overlapping relationship with the first body.

11. The susceptor of claim 9, wherein the fastener is located in at least one of the second holes of the second body.

12. The susceptor of claim 1, wherein the second body is rotatably coupled relative to the first body.

13. The susceptor of claim 12, wherein:
   rotation of one of the first body or the second body relative to the other of the first body or the second body by a first amount or first direction causes one or more of the first holes to be in substantial alignment with one or more second holes, and
   rotation of one of the first body or the second body relative to the other of the first body or the second body by a second amount or second direction causes at least one first hole to be misaligned with all of the second holes.

14. The susceptor of claim 1, wherein the first and second holes have different sizes.

* * * * *